United States Patent
Scheibe et al.

(10) Patent No.: US 6,558,757 B1
(45) Date of Patent: May 6, 2003

(54) METHOD AND DEVICE FOR COATING SUBSTRATES IN A VACUUM

(75) Inventors: Hans-Joachim Scheibe, Dresden (DE); Carl-Friedrich Meyer, Pappritz (DE); Bernd Schultrich, Dresden (DE); Holger Ziegele, Lorch (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/763,650

(22) PCT Filed: Aug. 20, 1999

(86) PCT No.: PCT/EP99/06129

§ 371 (c)(1),
(2), (4) Date: Mar. 19, 2001

(87) PCT Pub. No.: WO00/12775

PCT Pub. Date: Mar. 9, 2000

(30) Foreign Application Priority Data

Aug. 26, 1998 (DE) .......................... 198 38 824
Oct. 31, 1998 (DE) .......................... 198 50 217

(51) Int. Cl.⁷ .................................. H05H 1/24
(52) U.S. Cl. .............. 427/569; 427/249.7; 427/249.1; 427/572; 118/723 VE; 118/621
(58) Field of Search .................. 427/249.1, 249.7, 427/255.23, 478, 596, 580, 526, 527, 561, 569, 570, 572; 209/197.38; 118/723 VE, 50.1, 723 PI, 715, 722, 620, 621

(56) References Cited

U.S. PATENT DOCUMENTS

| | | | |
|---|---|---|---|
| 4,987,007 A | * | 1/1991 | Wagal et al. .............. 427/53.1 |
| 5,254,832 A | | 10/1993 | Gartner et al. |
| 5,428,882 A | * | 7/1995 | Makowiecki et al. ...... 29/527.5 |
| 5,643,343 A | * | 7/1997 | Selifanov et al. ............. 51/306 |
| 5,698,273 A | | 12/1997 | Azad et al. |

FOREIGN PATENT DOCUMENTS

| | | |
|---|---|---|
| DE | 3901 401 | 9/1989 |
| DE | 279 695 | 6/1990 |
| DE | 279 695 A1 * | 6/1990 |
| DE | 195 38 110 | 4/1997 |
| EP | 0 437 890 | 7/1991 |
| JP | 5 279844 | 10/1993 |

OTHER PUBLICATIONS

Coll, Bernard F. et al. "Design of Vacuum Arc–Based Sources", First Australia–USA Workshop on Critical Issues in High Performance Wear Resistant Films, Wollongong, NSW Australia, 1–3 (Feb., 1995).

Duden Deutsches Universalwörterbuch, p. 384, Bibliographisches Institut & F.A. Brockhaus AG, Mannheim (1996).

U.S. patent application Ser. No. 09/763,636, Meyer et al., filed Feb. 26, 2001, pending.

* cited by examiner

Primary Examiner—Timothy Meeks
Assistant Examiner—Eric B Fuller
(74) Attorney, Agent, or Firm—Leydig Voit & Mayer, Ltd.

(57) ABSTRACT

The invention relates to a method and a device for coating substrates in a vacuum, in which a plasma is generated from a target using a laser beam and ionized particles of the plasma are deposited on the substrate in the form of a layer, inert reactive gas or a gas mixture being supplied. The solution according to the invention is intended to provide a possible way of supplying gases or gas mixtures in a locally and temporally defined manner. According to the invention, this object is achieved by the fact that the gas or gas mixture is supplied to the plasma from and/or through a porous target, the intention being that the target is to have a temporary storage function on account of its porosity.

32 Claims, 2 Drawing Sheets

METHOD AND DEVICE FOR COATING SUBSTRATES IN A VACUUM

Figure 1:
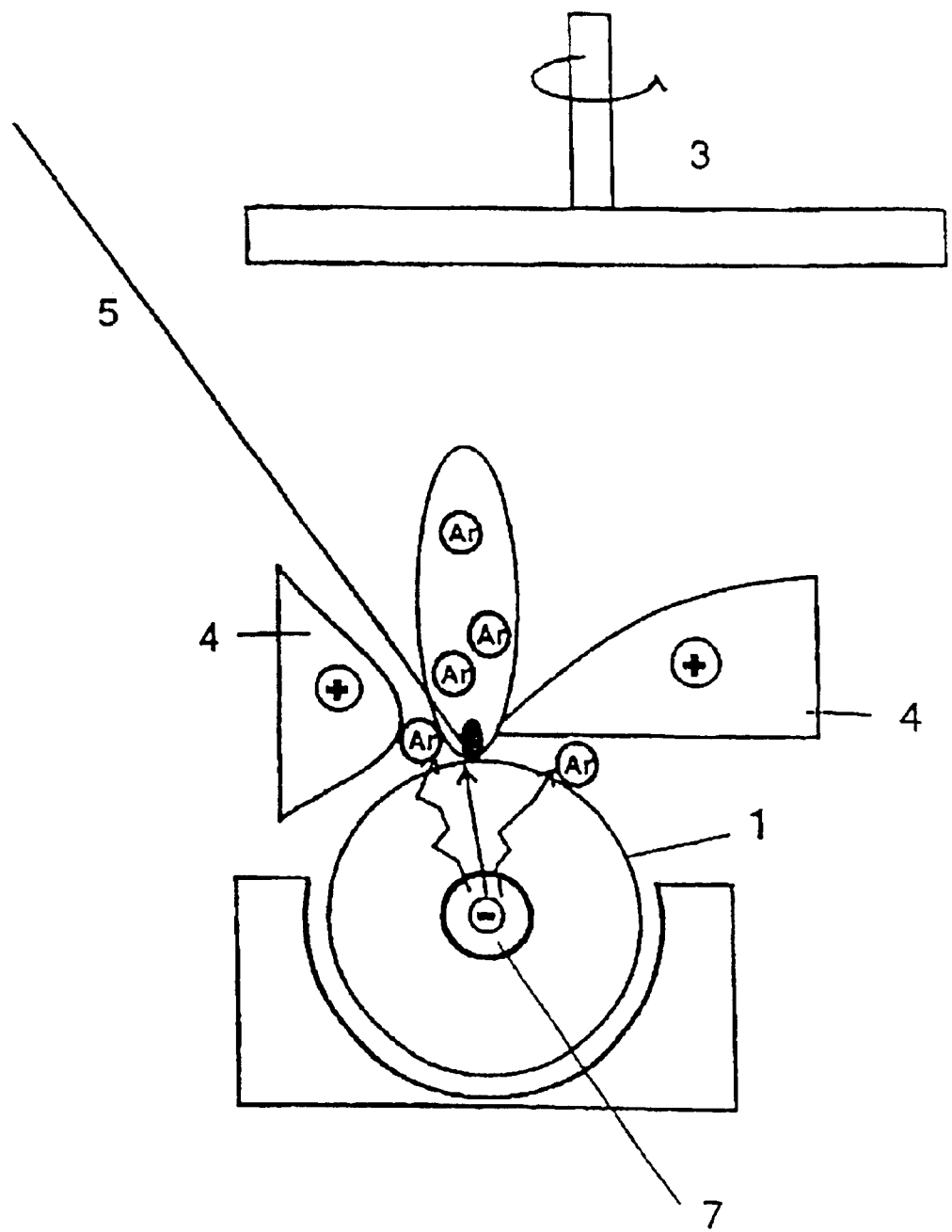

The invention relates to a method and a device for coating substrates in a vacuum in which a plasma is generated from a target using a laser beam and ionized particles of the plasma are deposited on the substrate in the form of a layer.

With a very wide range of known PVD methods which can be used to provide a very wide range of substrates with different coatings, it is known to influence certain properties of the layer by the addition of various gases or gas mixtures. Such gases or gas mixtures are added to the vacuum chamber at a correspondingly adjustable gas pressure. In a large number of these known methods, a certain proportion of a gas is at the same time sucked out again through a corresponding outlet opening.

On account of chemical reactions which take place when a reactive gas or gas mixture is supplied, the compounds which are formed with the vaporized target material and the corresponding gas component can be deposited as a layer, such as for example an oxide or nitride layer. The chemical reactions which take place in the vacuum chamber can only be influenced to a limited extent, and it is not generally possible to preclude inhomogeneities which have an adverse effect on the desired properties.

In a very wide range of PVD methods, a plasma is generated from a target and the ionized particles from the plasma are able to form a layer on the surface of a substrate. The plasma can be generated in a wide variety of ways, the solution according to the invention being particularly advantageously aimed at those PVb methods which are carried out the generation the plasma using a laser beam which is directed onto the target. The plasma can be generated purely with the aid of a laser beam of sufficient intensity or in combination with a vacuum arc discharge, which may also be ignited with laser assistance. Known methods of this nanotubes or fullerenes can be obtained in a layer of this type. Such structures may be incorporated in an amorphous layer in the form of powders or groups of fibers.

However, with these known solutions it is only possible to achieve relatively low yields or coating rates and to coat areas of relatively small dimensions. Moreover, the desired crystalline carbon structures are incorporated randomly with a low concentration in a layer of this type, and there is no possibility of having a controlled influence on a desired orientation or texturing.

Principal reasons for these drawbacks are that, on account of the high particle pressure in the plasma, it is substantially impossible for gases to penetrate into the plasma.

Moreover, a method for producing multicomponent materials in which a substrate is to be coated with ultrafine particles is known from U.S. Pat. No. 5,254,832 and EP 0 437 890 A1. The ultrafine particles are applied together with a further material component; this component can be applied by reactive deposition from an additional gas phase, by means of a pure CVD method or a correspondingly modified CVD method. In this case, an inert carrier gas is also used, which in one alternative is directed onto the surface of the target and, from there, toward the substrate and, in a second alternative, is directed onto the substrate through a target, which has been drilled through by a laser, and an opening in a diaphragm.

Therefore, it is an object of the invention, starting from known methods for coating substrates in a vacuum in which a plasma is generated from a target, to allow gases or gas mixtures to be supplied in a locally and/or temporally defined manner.

According to the invention, this object is achieved by the features of claims 1 and 4 for method and the features of claim 13 for a device for carrying out a method of this type. Advantageous configurations and refinements of the invention will emerge when the features given in the dependent claims are used. According to the invention, it is intended, starting from the methods described in DE 39 01 401 C1, DD 279 695 B5, CD 280 338 B5 and U.S. Pat. No. 4,987,007, gases or gas mixtures to be supplied in a locally and/or temporally defined manner.

According to the invention, this object is preferably achieved by the characterizing features of the invention. Advantageous embodiments and further developments will be apparent from the description of the invention provided herein. According to the invention, it is intended, starting from the methods described in DE 39 01 401 C1, DD 279 695 B5, DD 280 338 B5 and U.S. Pat. No. 4,987,007, to the full disclosure content of each of which reference is to be made for the invention, to provide the supplementary measure that at least one of the targets used has a certain degree of porosity which is suitable for fulfilling a temporary storage function for a gas or gas mixture in sufficient quantity and is suitable, both alone or in combination with the temporary storage function, for supplying the gas to the plasma through the pores in a temporally and/or locally defined manner.

It is advantageous to use a pulsed laser beam if the plasma, irrespective of whether this is generated by means of laser beam alone or by the combined use of laser beam and vacuum arc discharge, it being possible to appropriately select a suitable laser light source for the various possible target materials, in order to achieve a high level of efficiency.

In the laser arc process, the target should consist of an electrically conductive material, such as for example C, Al, Cu, Fe, Si, Ti another metal, alloys or chemical compounds. However, it is also possible to use other elements or their compounds, for example B or Ge. To ensure the required porosity, it is advantageously possible to use sintered bodies and/or fiber-reinforced composites for this purpose.

If the plasma is generated by means of laser beam alone, it is also possible to use targets made from electrically nonconductive materials, such as for example a very wide variety of oxides, nitrides and carbides.

As has already been mentioned, a target which is designed and is to be used in accordance with the invention can serve as a temporary store for the various gases or gas mixtures to be used. In this case, infiltration of the target with the corresponding gas or gas mixture, preferably up to its saturation limit, is carried out prior to the actual initiation of coating, and then the actual coating operation is initiated.

However, the corresponding gas or gas mixture may also. be supplied during the coating or, if the storage capacity of a target is inadequate, may be added during the coating via cavities formed inside the target or via a preferably tubular gas supply through the pores. However, the procedure should be such that the pores of the target which have emptied as a result of gas being consumed are refilled, so that the temporary storage function of the target is maintained.

The gas used may, for example, be inert gases (e.g. the gases of main group VIII), $O_2$, $N_2$, $H_2$ or hydrocarbon compounds or gas mixtures thereof, but also other gases and gas mixtures.

Apertures may preferably be formed in such a gas supply, through which apertures, at a constant gas pressure, a metered supply of gas to the plasma can be achieved on account of the restricting action of the apertures. This results in a further advantage, in that the corresponding gas or gas mixture can be passed via a circuit, of which the gas supply forms part, and the target is cooled by the gas, which is circulated in excess.

With the solution according to the invention it is particularly advantageously possible to produce diamond-like carbon coatings in which crystalline nanostructures are formed in a homogenously distributed manner. In this case, the possibility of both temporally and locally defined supply of gas has a particularly beneficial effect during the plasma generation.

Moreover, coordinated movement of the substrate (in translation, rotational pivoting/turning about an axis or a point) with respect to the plasma may lead to controlled texturing, i.e. a designed orientation of the nanocrystals.

The targets which are to be used in the invention should have a porosity of at least 3%, preferably more than 5%, in order to fulfill the desired properties.

If, by way of example, a multilayer structure of various layers is to be formed, it is possible to use at least two different suitable target materials. They may be arranged separately from one another, in which case at least one of the different targets is modified in accordance with the invention. It is also possible to supply different gases or gas mixtures over or out of these targets.

The various target materials may also be arranged immediately adjacent to one another, as may be the case, for example, when they form partial disks of a target in the form of a roller. In the latter case, the individual partial disks may be connected to separate gas supplies and, if appropriate, outlets.

Figure 2:
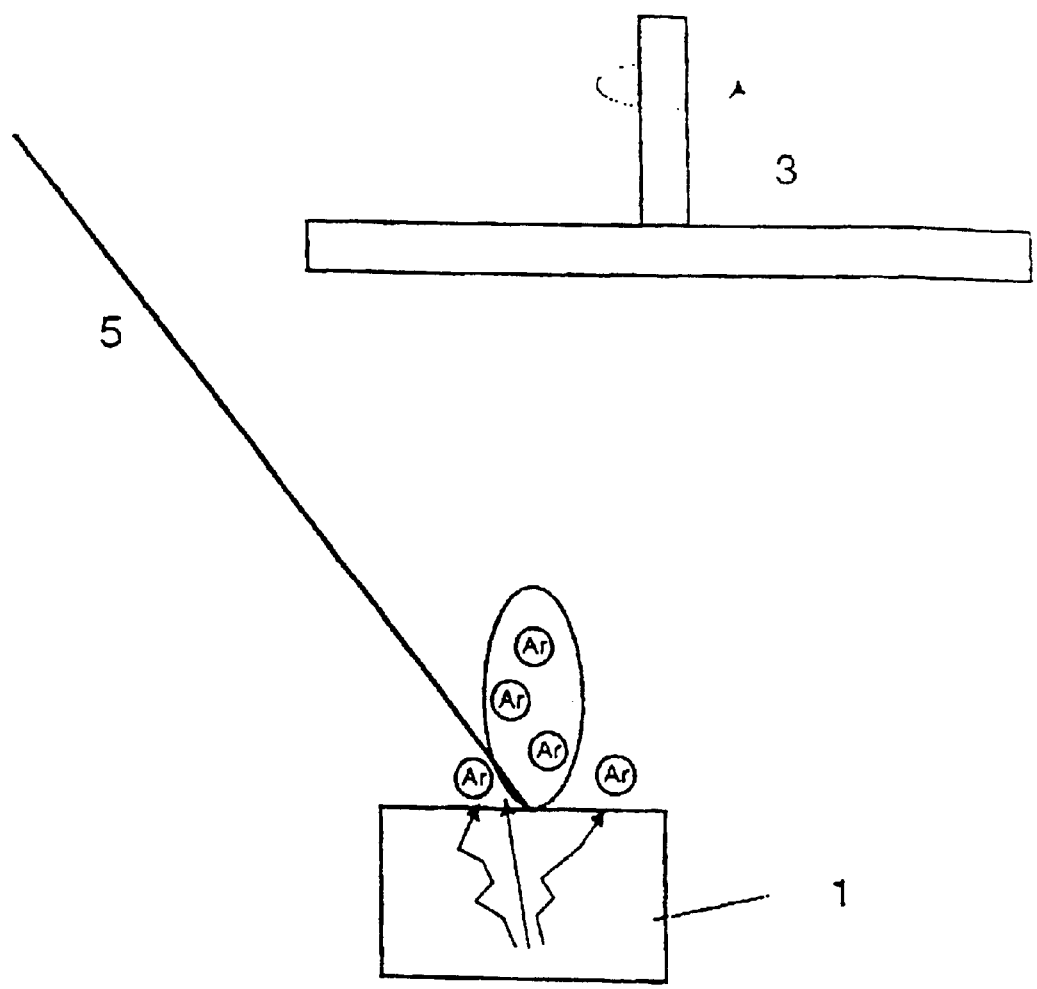

The invention is to be described by way of example below. In the drawing:

| FIG. 1 | shows the diagrammatic structure of a device according to the invention, in which plasma is generated from a target using the laser arc method, and |
| --- | --- |
| FIG. 2 | shows the diagrammatic structure of an example of a device in which plasma is generated from a target using a pulsed laser beam. |

In all the devices shown in FIGS. 1 and 2, the vacuum chamber in which the individual components illustrated in the figures are accommodated has been omitted, since it can be assumed that this is obvious to the relevant person skilled in the art.

In the example of a device according to the invention which is shown in FIG. 1, a target 1 which is in the form of a roller and is rotated uniformly about its longitudinal axis is used. An anode 4 is used to generate a plasma from an arc discharge, which anode, in a preferred form, is designed as an anode screen with a central gap through which the plasma generated can emerge, as indicated by the shape of the anode 4 illustrated in FIG. 1. To ignite the vacuum arc discharge, a laser beam 5 in pulsed form is directed onto the circumferential surface of the target 1 and, at the same time, the anode voltage is increased accordingly, so that an arc discharge can be ignited between target 1 and anode 4 and, following the vaporization of target material, a plasma can be generated, which passes through the anode gap toward the substrate 3.

In this example, an electrically negative potential may be applied to the substrate 3, which may be advantageous for certain purposes (acceleration of the ions). However, it is not generally necessary for an electrically negative potential to be applied to the substrate, but rather connection to the ground of the device may also be quite sufficient.

This method or a device of this type can be used to coat relatively large-area substrates 3, and correspondingly long roller-like targets 1 can be used. The size of area to be coated can be limited only by the limits of the beam-shaping unit of the laser beam 5, in which case, if appropriate, it is, however, also possible to use two or more laser beams in parallel.

Moreover, FIG. 1 shows a tubular gas supply 7 through the interior of the roller-like target 1, through which the gas or gas mixture used in each case can be passed over its entire length through the target 1, which is in the form of a roller. The tubular gas supply 7 may, for example, be made from a relatively mechanically strong metal, in the circumferential surface of which apertures are formed distributed at regular intervals and regularly over the circumference, through which apertures the gas or gas mixture can penetrate into the porous material of the roller-like target 1 and can pass to the surface, i.e. the outer circumferential surface of the roller-like target 1, from where it can pass directly into the plasma. At the two end sides of the tubular gas supply 7 there may be connections (not shown) for a gas supply and gas outlet, via which the gas or gas mixture used, if appropriate including a heat exchanger, can be circulated in order, at the same time, to cool the roller-like target 1.

In the example of a device according to the invention which is shown in FIG. 2, the same individual components as in the example shown in FIG. 1 are used, the only difference being that the plasma is generated by means of laser beam 5 alone.

A conventionally shaped but porous target 1 is used, which in this case is at a negative potential, although this measure may also be dispensed with. A preferably pulsed laser beam 5 is directed onto the target 1, and the plasma is generated from the target material using the energy of this laser beam alone. The target 1 may consist of electrically nonconductive or electrically conductive material, depending on what type of layer is to be formed on the substrate 3.

As in the general part of the description of the solution according to the invention, the planar target 1 illustrated in FIG. 2 may be used according to the invention solely by exploiting the storage capacity in the target 1, but it is also possible, in an embodiment which is not shown here, for cavities to be formed in its interior, into which cavities gas or gas mixture can be introduced, or alternatively, once again not shown, for a box-like cavity to be arranged beneath the planar target 1, into which cavity gas or gas mixture can at least be introduced. In the latter case, the gas metering may be effected by adjusting the pressure in the cavity, taking into account the porosity of the target material.

In a device as described by the example shown in FIG. 1, which can be operated in conjunction with the known laser arc method, it is possible for a very wide range of layers to be applied to a very wide range of substrates. For example, it is possible for aluminum, various aluminum compounds (by adding correspondingly reactive gases) and also diamond-like carbon layers to be applied.

The formation of a diamond-like carbon layer is illustrated in FIGS. 1 and 2. In this case, argon was supplied as noble gas via the target 1, and the way in which the ionized carbon, in the two SP2 and SP3 phases which are typical of diamond-like carbon, is deposited on the surface of the substrate 3, which in this case is being rotated in each case about an axis in order to form a texture, can also be seen. The electrons from the plasma should preferably be kept away from the substrate, i.e. from the layer which is being formed.

Targets with the following properties have proven particularly advantageous in particular for the production of diamond-like carbon layers:

| | |
|---|---|
| Density: | 1.88 g/cm$^3$ |
| Porosity: | 10% by volume in accordance with DIN 66133 |
| Pore size: | 0.6 µm in accordance with DIN 66133 |
| Resistivity: | 13 microohm meter |

What is claimed is:

1. A method for coating substances in a vacuum comprising:
generating a plasma from a porous target using a laser beam, the porous target including cavities formed inside;
depositing ionized particles of the plasma on the substrate in the form of a layer; and
supplying inert and/or reactive gas or a gas mixture;
wherein the gas or gas mixture, prior to the coating, infiltrates into the porous target where it is temporarily stored on account of the porosity and cavities of the target, the stored gas or gas mixture then supplied to the plasma from and/or through the target.

2. The method as claimed in one of claim 1, wherein the target is made from an electrically conductive material.

3. The method as claimed in claim 1, wherein the gas or gas mixture is passed in excess in a circuit through the cavities or a tubular gas supply.

4. The method as claimed in claim 1, wherein the target is made from C, Si, B, Ge or a metal or an alloy or a compound of these elements.

5. The method as claimed in claim 1, wherein the gas used is an inert gas, $O_2$, $N_2$, $H_2$ or a hydrocarbon compound or a gas mixture.

6. The method as claimed in claim 1, wherein the substrate, during the coating, is moved in translation and/or rotation and/or is pivoted about a point or an axis.

7. The method as claimed in claim 1, wherein diamond-like carbon coatings are produced using a carbon target.

8. The method as claimed in claim 1, wherein the laser beam is pulsed.

9. The method as claimed in claim 8, wherein the plasma is generated using a vacuum arc discharge which is ignited by means of the pulsed laser beam.

10. A device for carrying out the method as claimed in claim 1, wherein the target consists of a porous material, the porosity of which fulfills the functions(s) of storing a gas or gas mixture in the pores and/or supplying the gas or gas mixture to the plasma through the pores.

11. The device as claimed in claim 10, wherein the target is a sintered body.

12. The device as claimed in claim 10, wherein the target has a porosity of at least 3%.

13. The device as claimed in claim 10, wherein the target is rotatable and is designed in the form of a roller.

14. The device as claimed in claim 10, wherein a tubular gas supply, the circumferential surface of which has apertures for gas metering, is present in the interior of the target.

15. The device as claimed in claim 10, wherein, in addition to the target which is connected as cathode, there is an anode, an arc discharge being ignited between them by means of the laser beam.

16. A method for coating substrates in a vacuum comprising:
generating a plasma from a porous target by means of a vacuum arc discharge, the porous target including cavities formed inside;
depositing ionized particles of the plasma on the substrate in the form of a layer; and
supplying inert and/or reactive gas or a gas mixture;
wherein the gas or gas mixture, prior to the coating, infiltrates into the porous target where it is temporarily stored on account of the porosity and cavities of the target, the stored gas or gas mixture then supplied to the plasma from and/or through the target.

17. The method as claimed in one of claim 16, wherein the target is made from an electrically conductive material.

18. The method as claimed in claim 16, wherein the gas or gas mixture is passed in excess in a circuit through the cavities or a tubular gas supply.

19. The method as claimed in claim 16, wherein the target is made from C, Si, B, Ge or a metal or an alloy or a compound of these elements.

20. The method as claimed in claim 16, wherein the gas used is an inert gas, $O_2$, $N_2$, $H_2$ or a hydrocarbon compound or a gas mixture.

21. The method as claimed in claim 16, wherein the substrate, during the coating, is moved in translation and/or rotation and/or is pivoted about a point or an axis.

22. The method as claimed in claim 16, wherein diamond-like carbon coatings are produced using a carbon target.

23. A device for carrying out the method as claimed in claim 16, wherein the target consists of a porous material, the porosity of which fulfills the functions(s) of storing a gas or gas mixture in the pores and/or supplying the gas or gas mixture to the plasma through the pores.

24. The device as claimed in claim 23, wherein the target is a sintered body.

25. The device as claimed in claim 23, wherein the target has a porosity of at least 3%.

26. The device as claimed in claim 23, wherein the target is rotatable and is designed in the form of a roller.

27. The device as claimed in claim 23, wherein a tubular gas supply, the circumferential surface of which has apertures for gas metering, is present in the interior of the target.

28. The device as claimed in claim 23, wherein, in addition to the target which is connected as cathode, there is an anode, an arc discharge being ignited between them by means of the laser beam.

29. A method for coating substrates in a vacuum comprising:
generating a plasma from a porous target;
depositing ionized particles of the plasma on the substrate in the form of a layer; and
supplying inert and/or reactive gas or a gas mixture,
wherein the gas or gas mixture is supplied to the plasma from a tubular gas supply disposed through the target, the gas or gas mixture thereby having passed through the target which has a temporary storage function for the gas or gas mixture on account of its porosity.

30. The method of claim 29, wherein the plasma is generated using a laser beam.

31. The method of claim 29, wherein the plasma is generated using vacuum arc discharge.

32. A device for carrying out the method as claimed in claim 29, wherein the target is made of porous material, the porosity of which fulfills the functions of storing a gas or gas mixture in the pores and/or supplying the gas or gas mixture to the plasma through the pores, the gas or gas supply mixture supplied to the pores from a tubular gas supply disposed through the target.

* * * * *